(12) United States Patent
Huang et al.

(10) Patent No.: US 10,892,013 B2
(45) Date of Patent: Jan. 12, 2021

(54) TWO-PORT TERNARY CONTENT ADDRESSABLE MEMORY AND LAYOUT PATTERN THEREOF, AND ASSOCIATED MEMORY DEVICE

(71) Applicant: UNITED MICROELECTRONICS CORP., Hsin-Chu (TW)

(72) Inventors: Chun-Hsien Huang, Tainan (TW); Ching-Cheng Lung, Tainan (TW); Yu-Tse Kuo, Tainan (TW); Shu-Ru Wang, Taichung (TW); Chun-Yen Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/439,680

(22) Filed: Jun. 12, 2019

(65) Prior Publication Data

US 2020/0365207 A1    Nov. 19, 2020

(30) Foreign Application Priority Data

May 16, 2019    (CN) .......................... 2019 1 0408706

(51) Int. Cl.
*G11C 15/00*    (2006.01)
*G11C 29/00*    (2006.01)
(Continued)

(52) U.S. Cl.
CPC .......... *G11C 15/04* (2013.01); *H01L 27/0207* (2013.01); *H01L 27/1104* (2013.01);
(Continued)

(58) Field of Classification Search
CPC . G11C 15/04; H01L 27/0207; H01L 27/1104; H01L 27/1116
(Continued)

(56) References Cited

U.S. PATENT DOCUMENTS 6,411,538 B1 *  6/2002  Kengeri ................. G11C 15/04
                                                    365/168
6,845,025 B1 *  1/2005  Nataraj .................. G11C 15/04
                                                    327/103
(Continued)

OTHER PUBLICATIONS

Kostas Pagiamtzis, Ali Sheikholeslami, "Content-Addressable Memory (CAM) Circuits and Architectures: A Tutorial and Survey", Mar. 2006, IEEE, USA.
(Continued)

*Primary Examiner* — Ly D Pham
(74) *Attorney, Agent, or Firm* — Winston Hsu

(57) ABSTRACT

A two-port ternary content addressable memory (TCAM) and layout pattern thereof, and associated memory device are provided. The two-port TCAM may include a first storage unit, a second storage unit, a set of first search terminals, a set of second search terminals, a first comparison circuit, a second comparison circuit, a first match terminal and a second match terminal, wherein the first comparison circuit is respectively coupled to the first storage unit, the second storage unit, the set of first search terminals and the first match terminal, and the second comparison circuit is respectively coupled to the first storage unit, the second storage unit, the set of second search terminals and the second match terminal. First search data and second search data may be concurrently inputted into the two-port TCAM for determining whether the first search data and the second search data match content data within the two-port TCAM.

7 Claims, 5 Drawing Sheets

(51) Int. Cl.
  *G11C 15/04* (2006.01)
  *H01L 27/11* (2006.01)
  *H01L 27/02* (2006.01)
  *G06F 7/74* (2006.01)

(52) U.S. Cl.
  CPC ............ *H01L 27/1116* (2013.01); *G06F 7/74* (2013.01); *G11C 15/00* (2013.01)

(58) Field of Classification Search
  USPC .................. 365/49, 49.17, 154, 168, 189.07
  See application file for complete search history.

(56) References Cited

U.S. PATENT DOCUMENTS

| | | | | |
|---|---|---|---|---|
| 6,856,527 | B1* | 2/2005 | Srinivasan | ............ G11C 15/04 365/104 |
| 7,259,979 | B2 | 8/2007 | Sachan | |
| 7,355,873 | B2 | 4/2008 | Nii | |
| 7,904,642 | B1* | 3/2011 | Gupta | ............... G06F 16/90339 711/108 |
| 8,130,525 | B2 | 3/2012 | Arsovski | |
| 8,355,269 | B1 | 1/2013 | Zampaglione | |
| 9,858,006 | B1* | 1/2018 | Wu | ........................ G06F 3/0635 |
| 2006/0233011 | A1* | 10/2006 | Matsuoka | ................. G06F 7/74 365/49.17 |
| 2009/0135826 | A1* | 5/2009 | Kim | ...................... H04L 47/10 370/392 |
| 2009/0141528 | A1* | 6/2009 | Arsovski | ................ G11C 15/04 365/49.17 |
| 2009/0240875 | A1* | 9/2009 | Chu | ...................... G11C 15/043 711/108 |
| 2014/0198551 | A1* | 7/2014 | Louie | .................. G11C 15/046 365/49.1 |
| 2018/0068708 | A1* | 3/2018 | Nii | ...................... G11C 11/4125 |
| 2019/0392889 | A1* | 12/2019 | Trivedi | .................... G11C 7/08 |

OTHER PUBLICATIONS

Po-Tsang Huang, Wei Hwang, "A 65 nm 0.165 fJ/Bit/Search 256x144 TCAM Macro Design for IPv6 Lookup Tables", Feb. 2011, IEEE, USA.

Makoto Yabuuchi et al., 12-nm Fin-FET 3.0G-search/s 80-bit x 128-entry Dual-port Ternary CAM, 2018 Symposium on VLSI Circuits Digest of Technical Papers, 2018, pp. 19-20, IEEE, XP033427776.

* cited by examiner

TWO-PORT TERNARY CONTENT ADDRESSABLE MEMORY AND LAYOUT PATTERN THEREOF, AND ASSOCIATED MEMORY DEVICE

BACKGROUND OF THE INVENTION

1. Field of the Invention

The present invention is related to memory circuits, and more particularly, to a two-port ternary content addressable memory (TCAM) and layout pattern thereof, and an associated memory device. Specifically, the two-port TCAM is a two-port TCAM unit.

2. Description of the Prior Art

A content addressable memory (CAM) may be configured to execute functions of a lookup table in a system. More particularly, the CAM can complete comparison of a set of data in a single cycle and generate a match signal on a corresponding channel for output. CAMs may comprise binary CAMs (BCAMs) and ternary CAMs (TCAMs), wherein a BCAM (more specifically, a BCAM unit) may store a single bit of data, and the single bit of data may represent logic high and logic low (i.e. comprise two states); and a TCAM (more specifically, a TCAM unit) may store two bits of data, and the two bits of data may represent logic high, logic low and Don't care (i.e. comprise three states), wherein when the two bits of data represent Don't care, a comparison result is regarded as a match no matter the data being inputted for comparison.

Due to the feature of fast searching, CAMs are popular in many applications. With the development of Internet Of Things (IOT), improving performance of TCAMs without greatly increasing costs (e.g. power consumption and hardware area) has become an important issue in the art.

SUMMARY OF THE INVENTION

An objective of the present invention is to provide a two-port ternary content addressable memory (TCAM) and layout pattern thereof, and an associated memory device, which can finish data comparison of two sets of data in a single cycle and output corresponding comparison results.

Another objective of the present invention is to provide a two-port TCAM and layout pattern thereof, and an associated memory device, in order to improve overall speed of data searching without introducing any side effect or in a way that is less likely to introduce side effects.

At least one embodiment of the present invention provides a two-port TCAM. The two-port TCAM may comprise a first storage unit, a second storage unit, a set of first search terminals, a set of second search terminals, a first comparison circuit, a second comparison circuit, a first match terminal and a second match terminal, wherein the first comparison circuit is respectively coupled to the first storage unit, the second storage unit, the set of first search terminals and the first match terminal, and the second comparison circuit is respectively coupled to the first storage unit, the second storage unit, the set of second search terminals and the second match terminal. The first storage unit may be configured to store a first bit of content data, and the second storage unit may be configured to store a second bit of the content data. The set of first search terminals may be configured to input first search data into the two-port TCAM, and the set of second search terminals may be configured to input second search data into the two-port TCAM. The first comparison circuit may be configured to determine whether the first search data matches the content data and accordingly generate a first determination result, and the second comparison circuit may be configured to determine whether the second search data matches the content data and accordingly generate a second determination result. The first match terminal may be configured to output the first determination result, and the second match terminal may be configured to output the second determination result. In addition, the first search data and the second search data may be concurrently inputted into the two-port TCAM, and the first determination result and the second determination result may be concurrently outputted.

At least one embodiment of the present invention provides a layout pattern of a two-port TCAM, wherein the layout pattern may comprise a first comparison circuit, a second comparison circuit, a first storage unit, a second storage unit, a set of first search terminals, a set of second search terminals, a first match terminal and a second match terminal. The first comparison circuit is positioned in a first side area of a side of the layout pattern, and the second comparison circuit is positioned in a second side area of another side of the layout pattern. The first storage unit is positioned in a first middle area between the first side area and the second side area, and the second storage unit is positioned in a second middle area between the first side area and the second side area. The set of first search terminals is coupled to the first comparison circuit, and the set of second search terminals is coupled to the second comparison circuit. The first match terminal is coupled to the first comparison circuit, and the second match terminal is coupled to the second comparison circuit. More particularly, the first storage unit is connected to the first comparison circuit through a first gate structure and connected to the second comparison circuit through a second gate structure; additionally, the second storage unit is connected to the first comparison circuit through a third gate structure and connected to the second comparison circuit through a fourth gate structure.

At least one embodiment of the present invention provides a memory device. The memory device may comprise multiple sets of two-port TCAMs, multiple first output terminals, multiple second output terminals, one or more sets of first input terminals and one or more sets of second input terminals. Each set of two-port TCAMs within the multiple sets of two-port TCAMs comprises one or more TCAMs, wherein said each set of two-port TCAMs stores a set of data, and the one or more two-port TCAMs within said each set of two-port TCAMs respectively store one or more data units of the set of data. Both the multiple first output terminals and the multiple second output terminals are respectively coupled to the multiple sets of two-port TCAMs, and both the one or more sets of first input terminals and the one or more sets of second input terminals are respectively coupled to the one or more two-port TCAMs within said each set of two-port TCAMs. In addition, the one or more sets of first input terminals and the one or more sets of second input terminals may concurrently input first search data and second search data into the memory device, respectively, to determine whether the first search data and the second search data match data stored in the memory device; additionally, the multiple first output terminals and the multiple second output terminals may concurrently output corresponding search results according to the first search data and the second search data, respectively.

The architecture of the two-port TCAM disclosed in the present invention can finish comparison of two sets of data in one cycle, and implementing the embodiments of the present invention will not greatly increase costs. In addition, based on the above architecture, the layout pattern of the present invention can have extremely high symmetry, and thereby prevent pull up circuits (or pull down circuits) within a storage unit from having non-identical current due to stress effect. Thus, the present invention can improve performance of a two-port TCAM without introducing any side effect or on a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

A memory device having ternary content addressable memories (TCAMs) compares a set of search data with each set of content data stored in the memory device in order to search the set of search data in the memory device. In the related art, a TCAM can finish a search operation of one set of search data in a single cycle. In some embodiments, for the purpose of designing a two-port TCAM which is capable of finishing search operations of two sets of search data in a single cycle, an additional set of storage units for storing content data and corresponding comparison circuits can be added into a TCAM for the search operation of another set of search data. For example, a two-port TCAM may comprise two sets of storage units and two comparison circuits respectively coupled to the two sets of storage units, wherein the two sets of storage units store same content data, and the two comparison circuits may concurrently compare two sets of data which are concurrently inputted with the content data, and then generate corresponding results respectively. As data stored in a TCAM may comprise three states, and a set of storage units needs to comprise two storage units for storing two bits of the data, respectively, the two-port TCAM designed according to the aforementioned manner needs four storage units in total (e.g. four static random access memory (SRAM) units).

Figure 1:
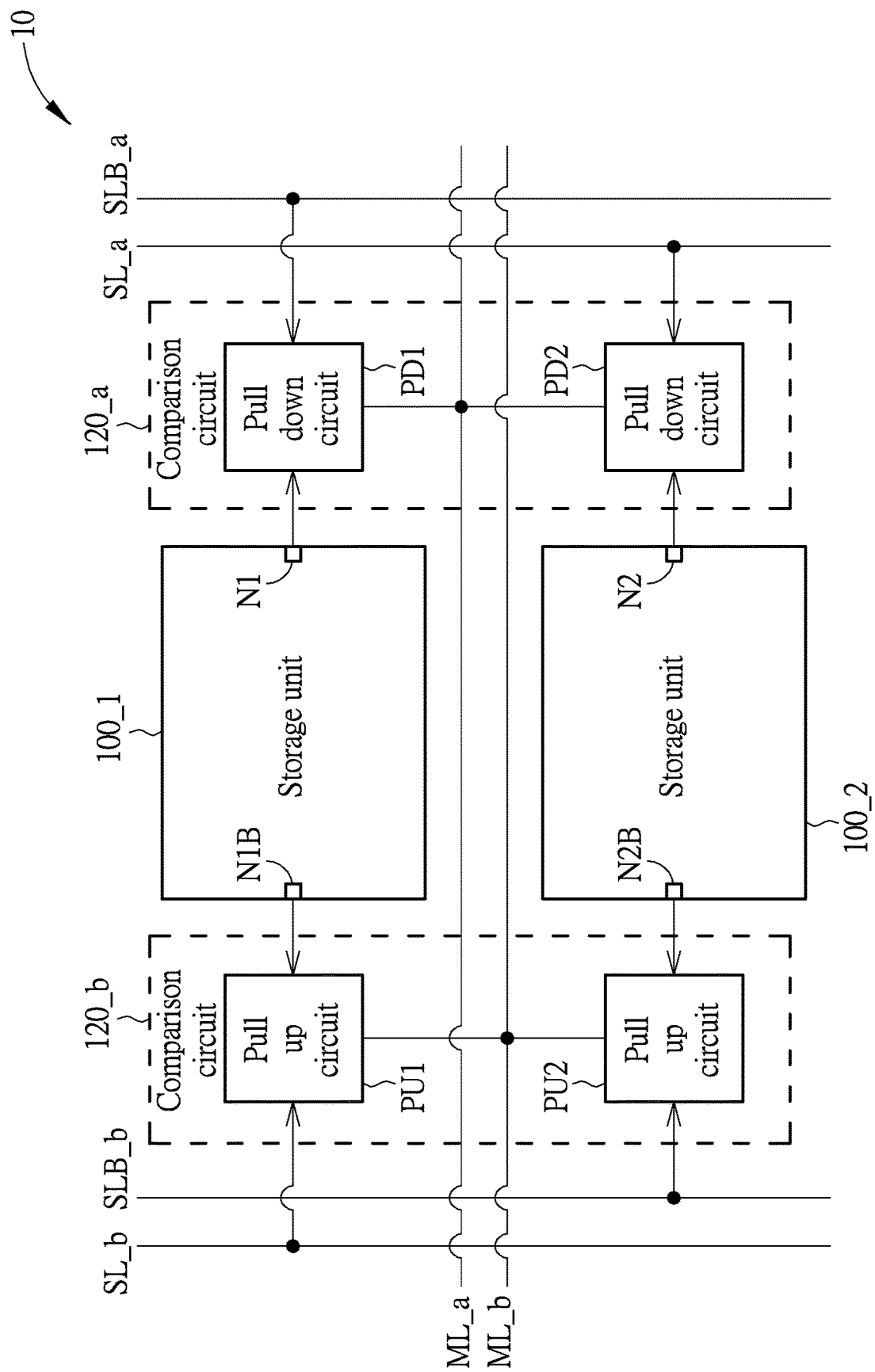
FIG. 1 is a diagram illustrating a two-port TCAM according to an embodiment of the present invention.

FIG. 1 is a diagram illustrating a two-port TCAM 10 (more specifically, a two-port TCAM unit) according to an embodiment of the present invention. The two-port TCAM 10 may comprise a first storage unit such as a storage unit 100_1, a second storage unit such as a storage unit 100_2, a set of first search terminals, a set of second search terminals, a first comparison circuit such as a comparison circuit 120_a, a second comparison circuit such as a comparison circuit 120_b, a first match terminal such as a match terminal ML_a and a second match terminal such as a match terminal ML_b. The comparison circuit 120_a is respectively coupled to the storage units 100_1 and 100_2, the set of first search terminals and the match terminal ML_a, and the comparison circuit 120_b is respectively coupled to the storage units 100_1 and 100_2, the set of second search terminal and the match terminal ML_b. The storage unit 100_1 may be configured to store a first bit of content data, and the storage unit 100_2 may be configured to store a second bit of the content data. The set of first search terminals may be configured to input first search data into the two-port TCAM 10 (e.g. into the comparison circuit 120_a therein), and the set of second search terminals may be configured to input second search data into the two-port TCAM 10 (e.g. into the comparison circuit 120_b therein). The comparison circuit 120_a may be configured to determine whether the first search data matches the content data and accordingly generate a first determination result, and the comparison circuit 120_b may be configured to determine whether the second search data matches the content data and accordingly generate a second determination result. The match terminal ML_a may be configured to output the first determination result, and the match terminal ML_b may be configured to output the second determination result. Note that the first search data and the second search data can be concurrently inputted into the two-port TCAM 10, and the first determination result and the second determination result can be concurrently outputted.

In this embodiment, the storage unit 100_1 may comprise storage nodes N1 and N1B, wherein the storage nodes N1 and N1B may be configured to store a first content value representing the first bit and a first inverted content value mutually complemented with the first content value. The storage unit 100_2 may comprise storage nodes N2 and N2B, wherein the storage nodes N2 and N2B may be configured to store a second content value representing the second bit and a second inverted content value mutually complemented with the second content value. In addition, the set of first search terminals comprises a first search line such as a search line SL_a and a first inverted search line such as a search line SLB_a, wherein the search lines SL_a and SLB_a respectively carry a first search value representing the first search data and a first inverted search value mutually complemented with the first search value. The set of second search terminals comprises a second search line such as a search line SL_b and a second inverted search line such as a search line SLB_b, wherein the search lines SL_b and SLB_b respectively carry a second search value representing the second search data and a second inverted search value mutually complemented with the second search value.

In this embodiment, the comparison circuit 120_a may comprise pull down circuits PD1 and PD2, wherein the pull down circuit PD1 is coupled to the storage node N1, the search line SLB_a and the match terminal ML_a, and the pull down circuit PD2 is coupled to the storage node N2, the search line SL_a and the match terminal ML_a. In addition, the comparison circuit 120_b may comprise pull up circuits PU1 and PU2, wherein the pull up circuit PU1 is coupled to the storage node N1B, the search line SL_b and the match terminal ML_b, and the pull up circuit PU2 is coupled to the storage node N2B, the search line SLB_b and the match line ML_b.

Figure 2:
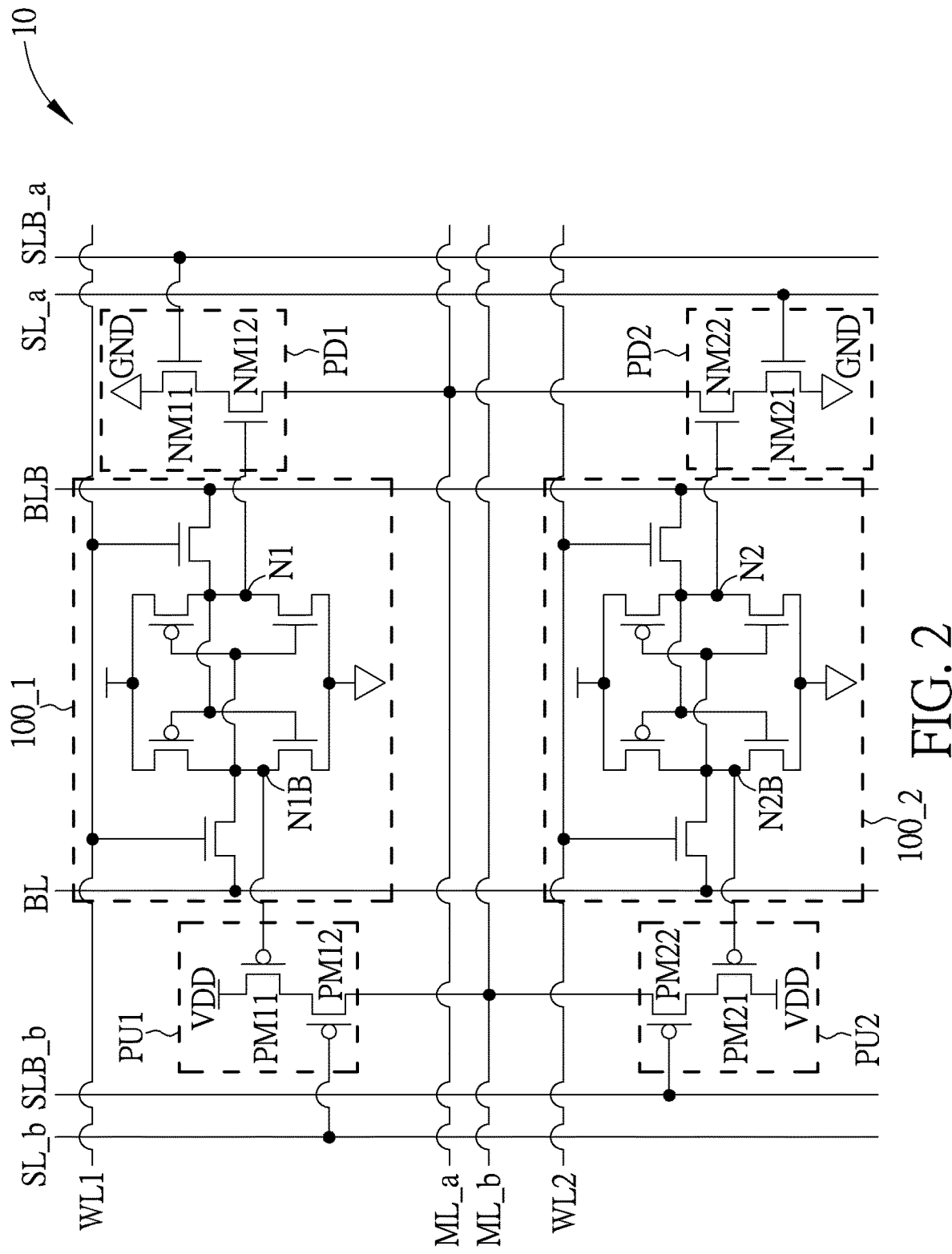
FIG. 2 is circuit architecture of the two-port TCAM according to an embodiment of the present invention.

FIG. 2 is circuit architecture of the two-port TCAM 10 according to an embodiment of the present invention, wherein the storage units 100_1 and 100_2 may respectively comprise a first SRAM unit and a second SRAM unit, but the present invention is not limited thereto. In this embodiment, access of the first SRAM may be controlled by a word line WL1, bit lines BL and BLB, and access of the second SRAM may be controlled by a word line WL2, the bit lines BL and BLB. Those skilled in this art should understand detailed operations according to the SRAM architecture illustrated in FIG. 2; related descriptions are omitted for brevity.

In this embodiment, the pull down circuit PD1 may be implemented by connecting two transistors (e.g. two N-type transistors such as transistors NM11 and NM12) in series. For example, a source terminal and a drain terminal of the transistor NM11 are respectively coupled to a first reference voltage terminal (such as a voltage terminal GND) and a source terminal of transistor NM12, and a drain terminal of the transistor NM12 is coupled to the match terminal ML_a, wherein gate terminals of the transistors NM11 and NM12 are respectively coupled to the search line SLB_a and the storage node N1 within the storage unit 100_1. In addition, the pull down circuit PD2 may be implemented by connecting two transistors (e.g. two N-type transistors such as transistors NM21 and NM22) in series. For example, a source terminal and a drain terminal of the transistor NM21 are respectively coupled to a first reference voltage terminal (such as the voltage terminal GND) and a source terminal of transistor NM22, and a drain terminal of the transistor NM22 is coupled to the match terminal ML_a, wherein gate terminals of the transistors NM21 and NM22 are respectively coupled to the search line SL_a and the storage node N2 within the storage unit 100_2. Note that connections of transistors NM11 and NM12 and connections of NM21 and NM22 are for illustrative purposes only, and are not limitations of the present invention. Any architecture of the pull down circuit PD1 that can make the match terminal ML_a be coupled to the first reference voltage terminal when both the first content value on the storage node N1 and the first inverted search value on the search line SLB_a are logic high, and any architecture of the pull down circuit PD2 that can make the match terminal ML_a be coupled to the first reference voltage terminal when both the second content value on the storage node N2 and the first search value on the search line SL_a are logic high, should belong to the present invention.

In this embodiment, the pull up circuit PU1 may be implemented by connecting two transistors (e.g. two P-type transistors such as transistors PM11 and PM12) in series. For example, a source terminal and a drain terminal of the transistor PM11 are respectively coupled to a second reference voltage terminal (such as a voltage terminal VDD) and a source terminal of transistor PM12, and a drain terminal of the transistor PM12 is coupled to the match terminal ML_b, wherein gate terminals of the transistors PM11 and PM12 are respectively coupled to the storage node N1B within the storage unit 100_1 and the search line SL_b. In addition, the pull up circuit PU2 may be implemented by connecting two transistors (e.g. two P-type transistors such as transistors PM21 and PM22) in series. For example, a source terminal and a drain terminal of the transistor PM21 are respectively coupled to a second reference voltage terminal (such as the voltage terminal VDD) and a source terminal of transistor PM22, and a drain terminal of the transistor PM22 is coupled to the match terminal ML_b, wherein gate terminals of the transistors PM21 and PM22 are respectively coupled to the storage node N2B within the storage unit 100_2 and the search line SLB_b. Note that connections of transistors PM11 and PM12 and connections of PM21 and PM22 are for illustrative purposes only, and are not limitations of the present invention. Any architecture of the pull up circuit PU1 that can make the match terminal ML_b be coupled to the second reference voltage terminal when both the first inverted content value on the storage node N1B and the second search value on the search line SL_b are logic low, and any architecture of the pull up circuit PU2 that can make the match terminal ML_b be coupled to the second reference voltage terminal when both the second inverted content value on the storage node N2B and the second inverted search value on the search line SLB_b are logic low, should belong to the present invention.

As shown in FIG. 2, the two-port TCAM 10 can finish comparison/search operations of two sets of data in a single cycle, and this architecture will not increase the number of SRAM units (only two SRAM units is required). Thus, the two-port TCAM 10 will not greatly increase a required number of transistors, so the manufacturing costs such as overall circuit area and power consumption will not be greatly increased.

Note that the match terminal ML_a may be coupled to a first precharge circuit (not shown), wherein the first precharge circuit may pull a voltage level of the match terminal ML_a to a first precharge level (e.g. a voltage level of the voltage terminal VDD) before the comparison circuit 120_a determines whether the first search data matches the content data. When the first search data does not match the content data, one of the pull down circuits PD1 and PD2 may pull down the voltage level of the match terminal ML_a from the first precharge level to a reference level (e.g. a voltage level of the voltage terminal GND) different from the first precharge level. In addition, the match terminal ML_b may be coupled to a second precharge circuit (not shown), wherein the second precharge circuit may pull a voltage level of the match terminal ML_b to a second precharge level (e.g. a voltage level of the voltage terminal GND) before the comparison circuit 120_b determines whether the second search data matches the content data. When the second search data does not match the content data, one of the pull up circuits PU1 and PU2 may pull up the voltage level of the match terminal ML_b from the second precharge level to a reference level (e.g. a voltage level of the voltage terminal VDD) different from the second precharge level.

Figure 3:
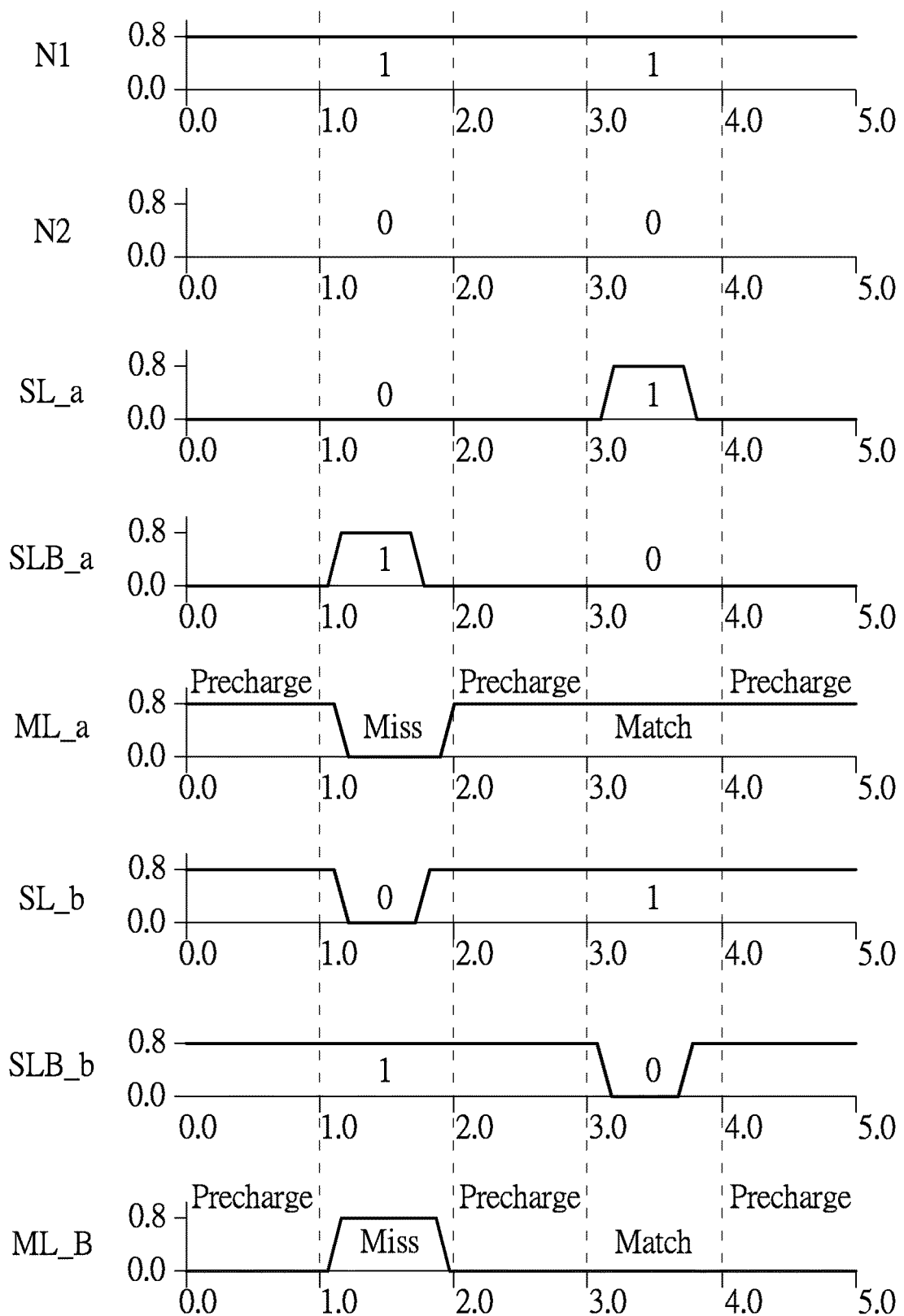
FIG. 3 is a diagram illustrating signals of the two-port TCAM according to an embodiment of the present invention.

FIG. 3 is a diagram illustrating signals of the two-port TCAM 10 according to an embodiment of the present invention. For better comprehension, refer to FIG. 3 in conjunction with FIG. 2, wherein a horizontal axis and a vertical axis of FIG. 3 respectively represent time and voltage levels. It should be noted that voltage levels illustrated on the vertical axis of FIG. 3 are for illustrative purposes only, and are not limitations of the present invention, wherein when a voltage level of a signal is 0 V, it means this signal is in a logic low state, and when the voltage level of the signal is 0.8 V, it means the signal is in a logic high state, but the present invention is not limited thereto. In this embodiment, assuming that the content data stored in the two-port TCAM is "1", logic states of the storage nodes N1 and N2 are logic high (labeled "1") and logic low (labeled "0") respectively, and logic states of the storage nodes N1B and N2B (not depicted in FIG. 3) are logic low and logic high respectively. In a first operation cycle (e.g. from t0 to t2), the match terminal ML_a may be precharged to 0.8 V first. As the first search data is "0" (search lines SL_a and SLB_a are logic low and logic high respectively), both the transistors NM11 and NM12 may be turned on to pull down the match terminal ML_a to 0 V, indicating a comparison result is "Miss" (i.e. no match). Additionally, the match terminal ML_b may be precharged to 0 V first. As the second search data is "0" (the search lines SL_b and SLB_b are logic low and logic high respectively), both the transistors PM11 and PM12 may be turned on to pull up the match terminal ML_b to 0.8 V, indicating a comparison result is "Miss" (i.e. no match). In a second operation cycle (e.g. from t2 to t4), the match terminal ML_a may be precharged to 0.8 V first. As the first search data is "1" (search lines SL_a and SLB_a are logic high and logic low respectively), both the transistors NM11 and NM22 may be turned off to make the match terminal ML_a maintain at 0.8 V, indicating the comparison result is "Match". Additionally, the match terminal ML_b may be precharged to 0 V first. As the second search data is "1" (the search lines SL_b and SLB_b are logic high and logic low respectively), both the transistors PM12 and PM21 may be turned off to make the match terminal ML_b maintain at 0 V, indicating the comparison result is "Match". Those skilled in this art should understand operations of the two-port TCAM 10 under a condition where the content data stored in the two-port TCAM 10 is "0", and related details are omitted for brevity. It should be noted that when a voltage level of a signal outputted by the match terminal ML_a is 0 V, it means the comparison result regarding the first search data is "Miss", and when the voltage level of the signal outputted by the match terminal ML_a is 0.8 V, it means the comparison result regarding the first search data is "Match"; additionally, when a voltage level of a signal outputted by the match terminal ML_b is 0 V, it means the comparison result regarding the second search data is "Match", and when the voltage level of the signal outputted by the match terminal ML_b is 0.8 V, it means the comparison result regarding the second search data is "Miss"; but the present invention is not limited thereto.

In addition, when the content data stored in the two-port TCAM 10 is Don't care, logic states of the storage nodes N1 and N2 are both logic low, and logic states of the storage nodes N1B and N2B are both logic high, so all the transistors NM12, NM22, PM11 and PM21 are turned off, making both the match terminals ML_a and ML_b maintain at respective precharge levels no matter the first search data and/or the second search data, which means the first determination result and the second determination result respectively indicate that the first search data and/or the second search data match the content data. Note that a condition where the logic states of the storage nodes N1 and N2 are both logic high is prohibited in this embodiment.

Figure 4:
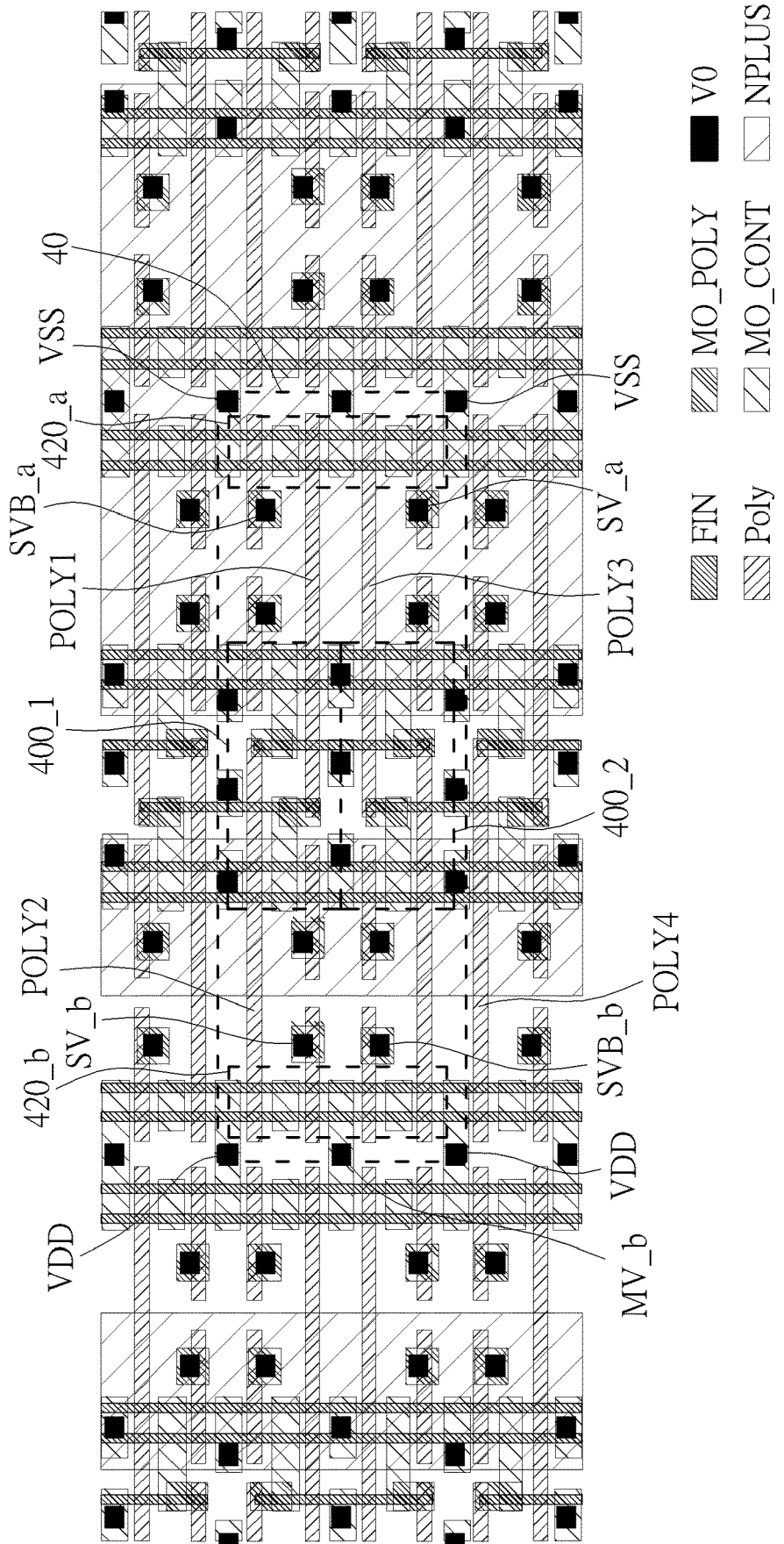
FIG. 4 is a layout pattern of the two-port TCAM according to an embodiment of the present invention.

FIG. 4 is a layout pattern 40 of the two-port TCAM 10 according to an embodiment of the present invention, wherein the layout pattern 40 may be constituted by fin structure layers (labeled "FIN"), gate structure (e.g. polysilicon) layers (labeled "Poly"), first connecting layers (configured to connect metal layers and the gate structure layers, labeled "M0_POLY"), second connecting layers (configured to connect the metal layers and the fin structure layers, labeled "M0_CONT"), via layers (configured to connect input/output terminals on the first connecting layers and the second connecting layers, labeled "V0") and N-type dopant layers (labeled "NPLUS"). The layout pattern 40 may comprise a first storage unit such as a storage unit 400_1, a second storage unit such as a storage unit 400_2, a set of first search terminals (comprising a first search line and a first inverted search line, such as search terminals {SV_a, SVB_a}), a set of second search terminals (comprising a second search line and a second inverted search line, such as search terminals {SV_b, SVB_b}), a first comparison circuit such as a comparison circuit 420_a, a second comparison circuit such as a comparison circuit 420_b, a first match terminal such as a match terminal MV_a and a second match terminal such as a match terminal MV_b, wherein the storage unit 400_1, the storage unit 400_2, the search terminals {SV_a, SVB_a}, the search terminals {SV_b, SVB_b}, the comparison circuit 420_a, the comparison circuit 420_b, the match terminal MV_a and the match terminal MV_b may be layout patterns of the storage unit 100_1, the storage unit 100_2, the search lines {SL_a, SLB_a}, the search lines {SL_b, SLB_b}, the comparison circuit 120_a, the comparison circuit 120_b, the match terminal ML_a and the match terminal ML_b respectively.

As shown in FIG. 4, the comparison circuit 420_a may be positioned in a first side area of a side of the layout pattern 40, and the comparison circuit 420_b may be positioned in a second side area of another side of the layout pattern 40. For example, the comparison circuit 420_a may be positioned in a right side area of the layout pattern 40, and the comparison circuit 420_b may be positioned in a left side area of the layout pattern 40; in another example, the comparison circuit 420_a may be positioned in the left side area of the layout pattern 40, and the comparison circuit 420_b may be positioned in the right side area of the layout pattern 40, but the present invention is not limited thereto. In addition, the storage unit 400_1 may be positioned in a first middle area between the first side area and the second side area, and the storage unit 400_2 may be positioned in a second middle area between the first side area and the second side area. For example, the storage unit 400_1 may be positioned in an upper-half area between the comparison circuits 420_a and 420_b, and the storage unit 400_2 may be positioned in a lower-half area between the comparison circuits 420_a and 420_b; in another example, the storage unit 400_1 may be positioned in the upper-half area between the comparison circuits 420_a and 420_b, and the storage unit 400_2 may be positioned in the lower-half area between the comparison circuits 420_a and 420_b, but the present invention is not limited thereto. The comparison circuit 420_a is respectively coupled to the storage units 400_1 and 400_2, the search terminals {SV_a, SVB_a} and the match terminals MV_a, and the comparison circuit 420_b is respectively coupled to the storage unit 400_1 and 400_2, the search terminals {SV_b, SVB_b} and the match terminal MV_b. More particularly, the storage unit 400_1 is connected to the comparison circuit 420_a through a first gate structure such as a gate structure POLY1 and connected to the comparison circuit 420_b through a second gate structure such as a gate structure POLY2, and the storage unit 400_2 is connected to the comparison circuit 420_a through a third gate structure such as a gate structure POLY3 and connected to the comparison circuit 420_b through a fourth gate structure such as a gate structure POLY4.

In this embodiment, the storage unit 400_1 may comprise a first inverter and a second inverter, wherein an input terminal and an output terminal of the first inverter are respectively coupled to the gate structures POLY1 and POLY2, and an input terminal and an output terminal of the second inverter are respectively coupled to the gate structures POLY2 and POLY1. The storage unit 400_2 may comprise a third inverter and a fourth inverter, wherein an input terminal and an output terminal of the third inverter are respectively coupled to the gate structures POLY3 and POLY4, and an input terminal and an output terminal of the fourth inverter are respectively coupled to the gate structures POLY4 and POLY3. In this embodiment, each of the first inverter and the second inverter within the storage unit 400_1 and the third inverter and the fourth inverter within the storage unit 400_2 comprise a pull up transistor and a pull down transistor, and each of the pull up transistor and the pull down transistor comprises a gate structure crossing over at least one fin structure (such as at least one fin structure formed in the fin structure layers).

The gate structure POLY1 may comprise the gate structure of the first inverter, e.g. the gate structure POLY1 may comprise the gate structure of the pull up transistor and the pull down transistor within the first inverter (such as a portion of the gate structure POLY1 positioned in the storage unit 400_1). The gate structure POLY2 may comprise the gate structure of the second inverter, e.g. the gate structure POLY2 may comprise the gate structure of the pull up transistor and the pull down transistor within the second inverter (such as a portion of the gate structure POLY2 positioned in the storage unit 400_1). The gate structure POLY3 may comprise the gate structure of the third inverter, e.g. the gate structure POLY3 may comprise the gate structure of the pull up transistor and the pull down transistor within the third inverter (such as a portion of the gate structure POLY3 positioned in the storage unit 400_2). The gate structure POLY4 may comprise the gate structure of the fourth inverter, e.g. the gate structure POLY4 may comprise the gate structure of the pull up transistor and the pull down transistor within the fourth inverter (such as a portion of the gate structure POLY4 positioned in the storage unit 400_2).

In this embodiment, the comparison circuit 420_a may comprise a first pull down circuit and a second pull down circuit. The first pull down circuit may be coupled between the match terminal MV_a and a first reference voltage, wherein a first control terminal of the first pull down circuit is coupled to the search terminal SVB_a, and a second control terminal of the first pull down circuit is coupled to the gate structure POLY1. In addition, the second pull down circuit may be coupled between the match terminal MV_a and a second reference voltage terminal, wherein a third control terminal of the second pull down circuit is coupled to the search terminal SV_a, and a fourth control terminal of the second pull down circuit is coupled to the gate structure POLY3. Note that this first reference voltage terminal and this second reference voltage terminal may have a same voltage level, e.g. this first reference voltage terminal and this second reference voltage terminal may be voltage terminals VSS respectively positioned in a top-right corner and a bottom-right corner of the layout pattern 40 (which may correspond to the aforementioned voltage terminal GND).

In detail, the first pull down circuit may comprise a first switch transistor and a second switch transistor, and the second pull down circuit may comprise a third switch transistor and a fourth switch transistor. For example, in the comparison circuit 420_a, the first switch transistor, the second switch transistor, the fourth switch transistor and the third switch transistor are disposed sequentially from the top to the bottom. The first switch transistor is coupled between the first reference voltage terminal (such as the voltage terminal VSS positioned in the top-right corner of the layout pattern 40) and the second switch transistor. The second switch transistor is coupled between the first switch transistor and the match terminal MV_a. The third switch transistor is coupled between the second reference voltage terminal (such as the voltage terminal VSS positioned in the bottom-right corner of the layout pattern 40) and the fourth switch transistor. The fourth switch transistor is coupled between the third switch transistor and the match terminal MV_a. In this embodiment, each of the first switch transistor, the second switch transistor, the third switch transistor and the fourth switch transistor comprises a gate structure crossing over at least one fin structure (such as at least one fin structure formed in the fin structure layers). The gate structure POLY1 comprises the gate structure of the second switch transistor, such as a portion of the gate structure POLY1 positioned in the comparison circuit 420_a. The gate structure POLY3 comprises the gate structure of the fourth switch transistor, such as a portion of the gate structure POLY3 positioned in the comparison circuit 420_a. The gate structure of the first switch transistor is coupled to the search terminal SVB_a, and the gate structure of the third switch transistor is coupled to the search terminal SV_a.

In addition, the comparison circuit 420_b may comprise a first pull up circuit and a second pull up circuit. The first pull up circuit may be coupled between the match terminal MV_b and a third reference voltage, wherein a first control terminal of the first pull up circuit is coupled to the gate structure POLY2, and a second control terminal of the first pull up circuit is coupled to the search terminal SV_b. In addition, the second pull up circuit may be coupled between the match terminal MV_b and a fourth reference voltage terminal, wherein a third control terminal of the second pull up circuit is coupled to the gate structure POLY4, and a fourth control terminal of the second pull up circuit is coupled to the search terminal SVB_b. Note that this third reference voltage terminal and this fourth reference voltage terminal may have a same voltage level, e.g. this third reference voltage terminal and this fourth reference voltage terminal may be voltage terminals VDD respectively positioned in a top-left corner and a bottom-left corner of the layout pattern 40.

In detail, the first pull up circuit may comprise a fifth switch transistor and a sixth switch transistor, and the second pull up circuit may comprise a seventh switch transistor and a eighth switch transistor. For example, in the comparison circuit 420_b, the fifth switch transistor, the sixth switch transistor, the eighth switch transistor and the seventh switch transistor are disposed sequentially from the top to the bottom. The fifth switch transistor is coupled between the third reference voltage terminal (such as the voltage terminal VDD positioned in the top-left corner of the layout pattern 40) and the sixth switch transistor. The sixth switch transistor is coupled between the fifth switch transistor and the match terminal MV_b. The seventh switch transistor is coupled between the fourth reference voltage terminal (such as the voltage terminal VDD positioned in the bottom-left corner of the layout pattern 40) and the eighth switch transistor. The eighth switch transistor is coupled between the seventh switch transistor and the match terminal MV_b. In this embodiment, each of the fifth switch transistor, the sixth switch transistor, the seventh switch transistor and the eighth switch transistor comprises a gate structure crossing over at least one fin structure (such as at least one fin structure formed in the fin structure layers). The gate structure POLY2 comprises the gate structure of the fifth switch transistor, such as a portion of the gate structure POLY2 positioned in the comparison circuit 420_b. The gate structure POLY4 comprises the gate structure of the seventh switch transistor, such as a portion of the gate structure POLY4 positioned in the comparison circuit 420_b. The gate structure of the sixth switch transistor is coupled to the search terminal SV_b, and the gate structure of the eighth switch transistor is coupled to the search terminal SVB_b.

Note that all transistors within regions covered by the N-type dopant layers in the layout pattern 40 are N-type transistors, while the rest are P-type transistors. Those skilled in this art should understand details related to connections of respective transistors within the layout pattern 40 according to the circuit architecture shown in FIG. 2 and layout of respective layers (such as the aforementioned fin structure layers, gate structure layers, first connecting layers, second connecting layers and via layers) within the layout pattern 40, and related details are omitted for brevity.

It should be noted that the gate structures POLY1 and POLY2 have extremely high symmetry in the layout pattern 40, and more particularly, truncated positions of the POLY1 and POLY2 are symmetric to each other, which makes pull up transistors (or pull down transistors) of the two inverters within the storage unit 400_1 have identical current; similarly, the gate structures POLY3 and POLY4 have extremely high symmetry in the layout pattern 40, and more particularly, truncated positions of the POLY3 and POLY4 are symmetric to each other, which makes pull up transistors (or pull down transistors) of the two inverters within the storage unit 400_2 have identical current.

Figure 5:
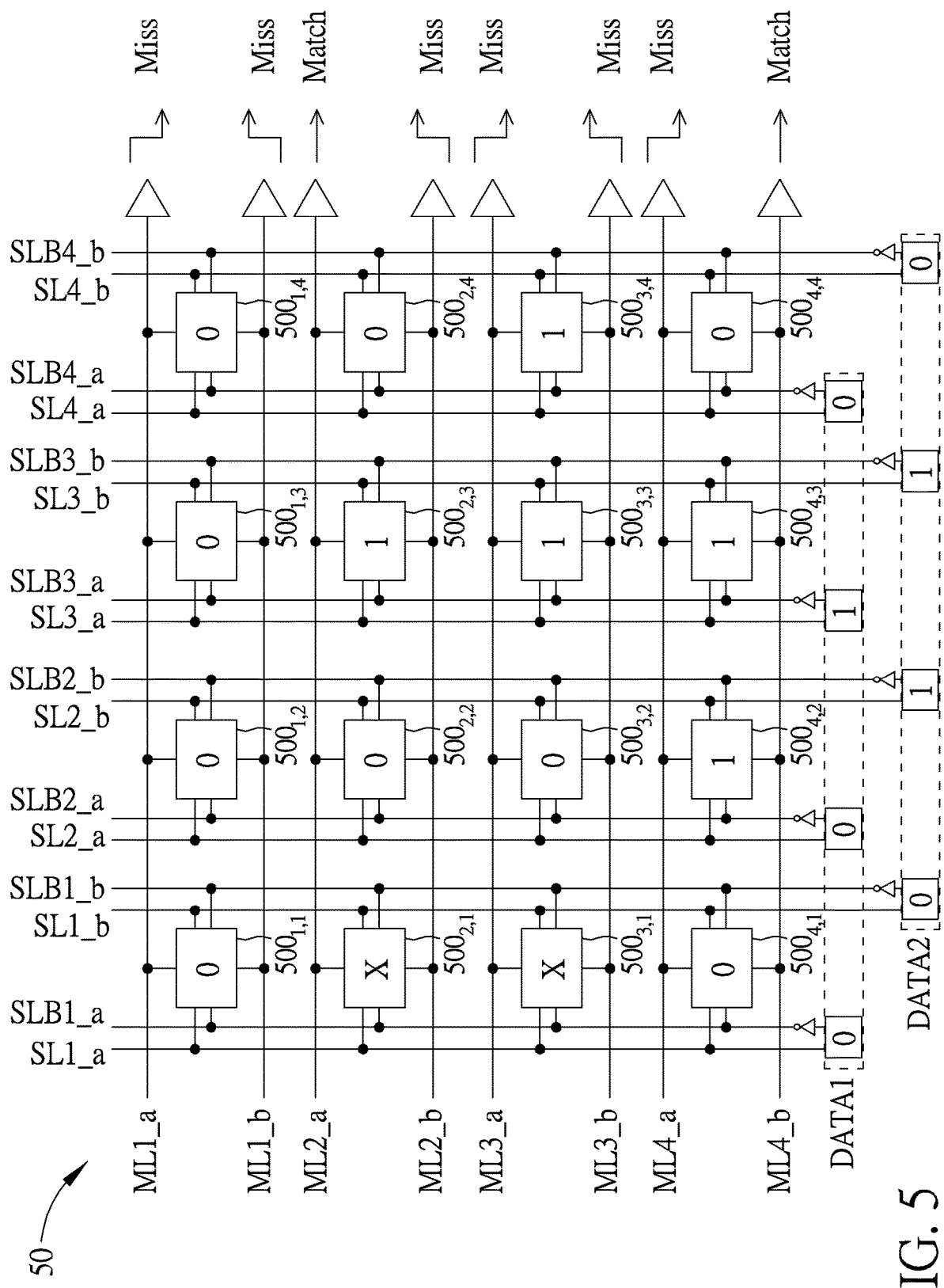
FIG. 5 is a diagram illustrating a memory device according to an embodiment of the present invention.

FIG. 5 is a diagram illustrating a memory device 50 according to an embodiment of the present invention. The memory device 50 may comprise multiple sets of two-port TCAMs, and each set of two-port TCAMs may comprise one or more two-port TCAMs.

As shown in FIG. 5, the multiple sets of two-port TCAMs comprises a first set of two-port TCAMs $\{500_{1,1}, 500_{1,2}, 500_{1,3}, 500_{1,4}\}$, a second set of two-port TCAMs $\{500_{2,1}, 500_{2,2}, 500_{2,3}, 500_{2,4}\}$, a third set of two-port TCAMs $\{500_{3,1}, 500_{3,2}, 500_{3,3}, 500_{3,4}\}$ and a fourth set of two-port TCAMs $\{500_{4,1}, 500_{4,2}, 500_{4,3}, 500_{4,4}\}$, wherein each set of two-port TCAMs stores a set of data, and one or more two-port TCAMs within each set of two-port TCAMs respectively store one or more data units of the set of data. For better comprehension, values labeled on respective two-port TCAMs in this embodiment may respectively represent content data stored in these two-port TCAMs. For example, the first set of two-port TCAMs $\{500_{1,1}, 500_{1,2}, 500_{1,3}, 500_{1,4}\}$ respectively store content data $\{0, 0, 0, 0\}$, the second set of two-port TCAMs $\{500_{2,1}, 500_{2,2}, 500_{2,3}, 500_{2,4}\}$ respectively store content data $\{X, 0, 1, 0\}$, the third set of two-port TCAMs $\{500_{3,1}, 500_{3,2}, 500_{3,3}, 500_{3,4}\}$ respectively store content data $\{X, 0, 1, 1\}$, and the fourth set of two-port TCAMs $\{500_{4,1}, 500_{4,2}, 500_{4,3}, 500_{4,4}\}$ respectively store content data $\{0, 1, 1, 0\}$, wherein the symbol "X" represents "Don't care".

As shown in FIG. 5, the memory device 50 may further comprise multiple first output terminals (such as output terminals ML1_a, ML2_a, ML3_a and ML4_a) and multiple second output terminals (such as output terminals ML1_b, ML2_b, ML3_b and ML4_b), wherein the multiple first output terminals and the multiple second output terminals are respectively coupled to the first set of two-port TCAMs $\{500_{1,1}, 500_{1,2}, 500_{1,3}, 500_{1,4}\}$, the second set of two-port TCAMs $\{500_{2,1}, 500_{2,2}, 500_{2,3}, 500_{2,4}\}$, the third set of two-port TCAMs $\{500_{3,1}, 500_{3,2}, 500_{3,3}, 500_{3,4}\}$ and the fourth set of two-port TCAMs $\{500_{4,1}, 500_{4,2}, 500_{4,3}, 500_{4,4}\}$. In addition, the memory device 50 may further comprise one or more sets of first input terminals (such as input terminals $\{SL1\_a, SLB1\_a\}$, $\{SL2\_a, SLB2\_a\}$, $\{SL3\_a, SLB3\_a\}$ and $\{SL4\_a, SLB4\_a\}$) and one or more sets of second input terminals (such as input terminals $\{SL1\_b, SLB1\_b\}$, $\{SL2\_b, SLB2\_b\}$, $\{SL3\_b, SLB3\_b\}$ and $\{SL4\_b, SLB4\_b\}$), wherein the one or more sets of first input terminals and the one or more sets of second input terminals are respectively coupled to one or more two-port TCAMs within each set of two-port TCAMs. For example, the input terminals $\{SL1\_a, SLB1\_a\}$ and $\{SL1\_b, SLB1\_b\}$ are coupled to the two-port TCAMs $500_{1,1}, 500_{2,1}, 500_{3,1}$ and $500_{4,1}$, the input terminals $\{SL2\_a, SLB2\_a\}$ and $\{SL2\_b, SLB2\_b\}$ are coupled to the two-port TCAMs $500_{1,2}, 500_{2,2}, 500_{3,2}$ and $500_{4,2}$, the input terminals $\{SL3\_a, SLB3\_a\}$ and $\{SL3\_b, SLB3\_b\}$ are coupled to the two-port TCAMs $500_{1,3}, 500_{2,3}, 500_{3,3}$ and $500_{4,3}$, and the input terminals $\{SL4\_a, SLB4\_a\}$ and $\{SL4\_b, SLB4\_b\}$ are coupled to the two-port TCAMs $500_{1,4}, 500_{2,4}, 500_{3,4}$ and $500_{4,4}$.

In this embodiment, the aforementioned each two-port TCAM may be implemented by the circuit architecture of the two-port TCAM 10 shown in FIG. 2. Taking the two-port TCAM $500_{1,1}$ as an example, the search lines $\{SL\_a, SLB\_a, SL\_b, SLB\_b\}$ and the match terminals $\{ML\_a, ML\_b\}$ may be respectively coupled to the input terminals $\{SL1\_a, SLB1\_a, SL1\_b, SLB1\_b\}$ and the output terminals $\{ML1\_a, ML1\_b\}$, wherein the rest may be deduced by analogy according to respective connections, and related details are therefore omitted for brevity.

In this embodiment, the one or more sets of first input terminals and the one or more sets of second input terminals may concurrently input first search data (such as data DATA1) and second search data (such as data DATA2) into the memory device 50 respectively, to determine whether the first search data and the second search data match data stored in the memory device 50 (i.e. data stored in two-port TCAMs within the memory device 50), and the output terminals $\{ML1\_a, ML2\_a, ML3\_a, ML4\_a\}$ and $\{ML1\_b, ML2\_b, ML3\_b, ML4\_b\}$ may concurrently output corresponding search results according to the data DATA1 and DATA2 respectively. For example, the data DATA1 and DATA2 are $\{0, 0, 1, 0\}$ and $\{0, 1, 1, 0\}$, wherein the data $\{X, 0, 1, 0\}$ of the second set of two-port TCAMs $\{500_{2,1}, 500_{2,2}, 500_{2,3}, 500_{2,4}\}$ matches the data DATA1, and the output terminal ML2_a may accordingly output a first result to indicate "Match" (the remaining output terminals such as ML1_a, ML3_a and ML4_a output a second result to indicate "Miss"); additionally, the data $\{0, 1, 1, 0\}$ of the fourth set of two-port TCAMs $\{500_{4,1}, 500_{4,2}, 500_{4,3}, 500_{4,4}\}$ matches the data DATA2, and the output terminal ML4_b may accordingly output the first result to indicate "Match" (the remaining output terminals such as ML1_b, ML2_b and ML3_b output the second result to indicate "Miss").

In detail, the output terminals ML1_a, ML2_a, ML3_a and ML4_a may be precharged to a first precharge level (e.g. the aforementioned voltage level of voltage terminal VDD) before outputting respective search results. Then, after the data DATA1 is inputted into respective two-port TCAMs within the memory device 50, the two-port TCAMs whose content data does not match the data DATA1 will pull down voltage levels of corresponding output terminals to a low voltage level (e.g. the aforementioned voltage level of the voltage terminal GND). For example, the output terminal ML1_a will be pulled down to the low voltage level as the content data of the two-port TCAM $500_{1,3}$ is missed; the output terminal ML3_a will be pulled down to the low voltage level as the content data of the two-port TCAM $500_{3,4}$ is missed; the output terminal ML4_a will be pulled down to the low voltage level as the content data of the two-port TCAM $500_{4,2}$ is missed; and the output terminal ML2_a will be maintained at the first precharge level. In addition, the output terminals ML1_b, ML2_b, ML3_b and ML4_b may be precharged to a second precharge level (e.g. the aforementioned voltage level of voltage terminal GND) before outputting respective search results. Then, after the data DATA2 is inputted into respective two-port TCAMs within the memory device 50, the two-port TCAMs whose content data does not match the data DATA1 will pull up voltage levels of corresponding output terminals to a high voltage level (e.g. the aforementioned voltage level of the voltage terminal VDD). For example, the output terminal ML1_b will be pulled up to the high voltage level as the content data of the two-port TCAMs $500_{1,2}$ and $500_{1,3}$ are missed; the output terminal ML2_b will be pulled up to the high voltage level as the content data of the two-port TCAM $500_{2,2}$ is missed; the output terminal ML3_b will be pulled up to the high voltage level as the content data of the two-port TCAMs $500_{3,2}$ and $500_{3,4}$ are missed; and the output terminal ML4_b will be maintained at the second precharge level.

Briefly summarized, the present invention provides a two-port TCAM and a memory device utilizing the two-port TCAM, which enables search/comparison operations of two sets of data to be finished in a single cycle. The present invention further provides a layout pattern of the two-port TCAM, wherein respective components within the layout pattern (more particularly, SRAM units therein) can have extremely high symmetry without the problems of non-identical pull up (or pull down) current due to the stress effect. In addition, implementation according to the circuit architecture of the present invention will not greatly increase additional costs such as transistor counts, hardware area, etc. Thus, the present invention can improve the performance of the two-port TCAM without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A two-port ternary content addressable memory (TCAM), comprising:
   a first storage unit, configured to store a first bit of a content data;
   a second storage unit, configured to store a second bit of the content data;
   a set of first search terminals, configured to input a first search data into the two-port TCAM;
   a set of second search terminals, configured to input a second search data into the two-port TCAM;
   a first comparison circuit, respectively coupled to the first storage unit, the second storage unit and the set of first search terminals, configured to determine whether the first search data matches the content data and accordingly generate a first determination result;
   a second comparison circuit, respectively coupled to the first storage unit, the second storage unit and the set of second search terminals, configured to determine whether the second search data matches the content data and accordingly generate a second determination result;
   a first match terminal, coupled to the first comparison circuit, configured to output the first determination result; and
   a second match terminal, coupled to the second comparison circuit, configured to output the second determination result;
   wherein the first search data and the second search data are concurrently inputted into the two-port TCAM, and the first determination result and the second determination result are concurrently outputted;
   wherein the first storage unit comprises a first storage node and a first inverted storage node respectively configured to store a first content value representing the first bit and a first inverted content value mutually complemented with the first content value; and the second storage unit comprises a second storage node and a second inverted storage node respectively configured to store a second content value representing the second bit and a second inverted content value mutually complemented with the second content value;
   wherein when both the first content value and the second content value are logic low, both the first determination result and the second determination result indicate that the first search data and the second search data matches the content data regardless of the first search data and the second search data.

2. The two-port TCAM of claim 1, wherein the first storage unit and the second storage unit comprise a first static random access memory (SRAM) unit and a second SRAM unit, respectively.

3. A two-port ternary content addressable memory (TCAM), comprising:
   a first storage unit, configured to store a first bit of a content data;
   a second storage unit, configured to store a second bit of the content data;
   a set of first search terminals, configured to input a first search data into the two-port TCAM;
   a set of second search terminals, configured to input a second search data into the two-port TCAM;
   a first comparison circuit, respectively coupled to the first storage unit, the second storage unit and the set of first search terminals, configured to determine whether the first search data matches the content data and accordingly generate a first determination result;
   a second comparison circuit, respectively coupled to the first storage unit, the second storage unit and the set of second search terminals, configured to determine whether the second search data matches the content data and accordingly generate a second determination result;
   a first match terminal, coupled to the first comparison circuit, configured to output the first determination result; and
   a second match terminal, coupled to the second comparison circuit, configured to output the second determination result;
   wherein the first search data and the second search data are concurrently inputted into the two-port TCAM, and the first determination result and the second determination result are concurrently outputted;
   wherein the first storage unit comprises a first storage node and a first inverted storage node respectively configured to store a first content value representing the first bit and a first inverted content value mutually complemented with the first content value; and the second storage unit comprises a second storage node and a second inverted storage node respectively configured to store a second content value representing the second bit and a second inverted content value mutually complemented with the second content value;
   wherein the set of first search terminals comprises a first search line and a first inverted search line respectively carrying a first search value representing the first search data and a first inverted search value mutually complemented with the first search value; and the set of second search terminals comprises a second search line and a second inverted search line respectively carrying a second search value representing the second search data and a second inverted search value mutually complemented with the second search value.

4. The two-port TCAM of claim 3, wherein the first comparison circuit comprises:
    a first pull down circuit, coupled to the first storage node, the first inverted search line and the first match terminal; and
    a second pull down circuit, coupled to the second storage node, the first search line and the first match terminal;
    wherein when the first search data does not match the content data, one of the first pull down circuit and the second pull down circuit pulls down a voltage level of the first match terminal from a precharge level to a reference level different from the precharge level.

5. The two-port TCAM of claim 4, wherein the first pull down circuit makes the first match terminal be coupled to a reference voltage terminal when both the first content value and the first inverted search value are logic high, and the second pull down circuit makes the first match terminal be coupled to the reference voltage terminal when both the second content value and the first search value are logic high, wherein the reference level represents a voltage level of the reference voltage terminal.

6. The two-port TCAM of claim 3, wherein the second comparison circuit comprises:
    a first pull up circuit, coupled to the first inverted storage node, the second search line and the second match terminal; and
    a second pull up circuit, coupled to the second inverter storage node, the second inverted search line and the second match terminal;
    wherein when the second search data does not match the content data, one of the first pull up circuit and the second pull up circuit pulls up a voltage level of the second match terminal from a precharge level to a reference level different from the precharge level.

7. The two-port TCAM of claim 6, wherein the first pull up circuit makes the second match terminal be coupled to a reference voltage terminal when both the first inverted content value and the second search value are logic low, and the second pull up circuit makes the second match terminal be coupled to the reference voltage terminal when both the second inverted content value and the second inverted search value are logic low, wherein the reference level represents a voltage level of the reference voltage terminal.

* * * * *